United States Patent
Costello

[11] Patent Number: 6,089,882
[45] Date of Patent: *Jul. 18, 2000

[54] MEMORY CARD CONNECTOR WITH GROUNDING CLIP

[75] Inventor: Brian Patrick Costello, Redwood City, Calif.

[73] Assignee: The Whitaker Corporation, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/757,788

[22] Filed: Nov. 27, 1996

[51] Int. Cl.[7] .................................................. H01R 13/658
[52] U.S. Cl. ................................................................ 439/95
[58] Field of Search ............................... 439/95, 92, 101, 439/108, 607

[56] References Cited

U.S. PATENT DOCUMENTS

| | | | |
|---|---|---|---|
| 4,889,497 | 12/1989 | Riches | 439/95 |
| 5,288,247 | 2/1994 | Kaufman | 439/607 |
| 5,330,360 | 7/1994 | March et al. | 439/76 |
| 5,337,220 | 8/1994 | Granitz | 361/816 |
| 5,339,222 | 8/1994 | Simmons et al. | 361/818 |
| 5,472,349 | 12/1995 | Dixon et al. | 439/79 |
| 5,490,043 | 2/1996 | Tan et al. | 361/818 |
| 5,502,620 | 3/1996 | Funck et al. | 361/753 |
| 5,537,294 | 7/1996 | Siwinski | 361/753 |
| 5,547,397 | 8/1996 | Hirai | 439/607 |
| 5,564,933 | 10/1996 | Bouchan et al. | 439/101 |

FOREIGN PATENT DOCUMENTS

WO 96/10899  4/1996  WIPO .

*Primary Examiner*—Gary F. Paumen

[57] ABSTRACT

A grounding clip (50) for a memory card mountable to an insulative housing (16) of a connector (12) along a rear face thereof. The grounding clip (50) includes a ground tab (72) solderable to a ground pad (36G) of a circuit board (14) when connector (12) is secured thereto, and further includes spring arms (62,64) extending along and away from top and bottom surfaces (44,46) of the housing, to be engaged and deflected when top and bottom conductive covers (80,82) are secured around the connector and circuit board thereby grounding the covers to the circuit board ground circuit (36G).

10 Claims, 7 Drawing Sheets

MEMORY CARD CONNECTOR WITH GROUNDING CLIP

FIELD OF THE INVENTION

This relates to the field of electrical connectors and more particularly to connectors for use in memory cards

BACKGROUND OF THE INVENTION

Memory cards such as PCMCIA cards include electrical connectors at leading ends thereof to establish electrical interconnections with a complementary connector of an electronic apparatus such as a computer, upon insertion of the memory card into a card-receiving holder of the apparatus. Several such memory cards are disclosed in U.S. Pat. Nos. 5,339,222; 5,472,349; and 5,288,247; and also U.S. Pat. No. 5,641,314 hereof.

It is desired to simplify the assembly of memory cards.

SUMMARY OF THE INVENTION

The present invention simplifies memory card assembly by providing a grounding clip on a connector being mounted to an end of a memory card circuit card, that establishes a ground path between the circuit card and the conductive shield surrounding the assembly. The grounding clip includes a section that engages a ground pad of the circuit card when the connector is affixed to the end of the circuit card, and further includes a pair of elongate spring arms that are engaged and deflected by top and bottom conductive covers that enshroud and shield the circuit card when affixed therearound.

It is an objective of the present invention to establish a ground path between the circuit card and the conductive covers automatically upon fastening of the covers about the circuit card, thereby eliminating an extra step in the memory card assembly manufacturing process.

An embodiment of the invention will now be described by way of example with reference to the accompanying drawings

DETAILED DESCRIPTION OF THE INVENTION

Figure 1:
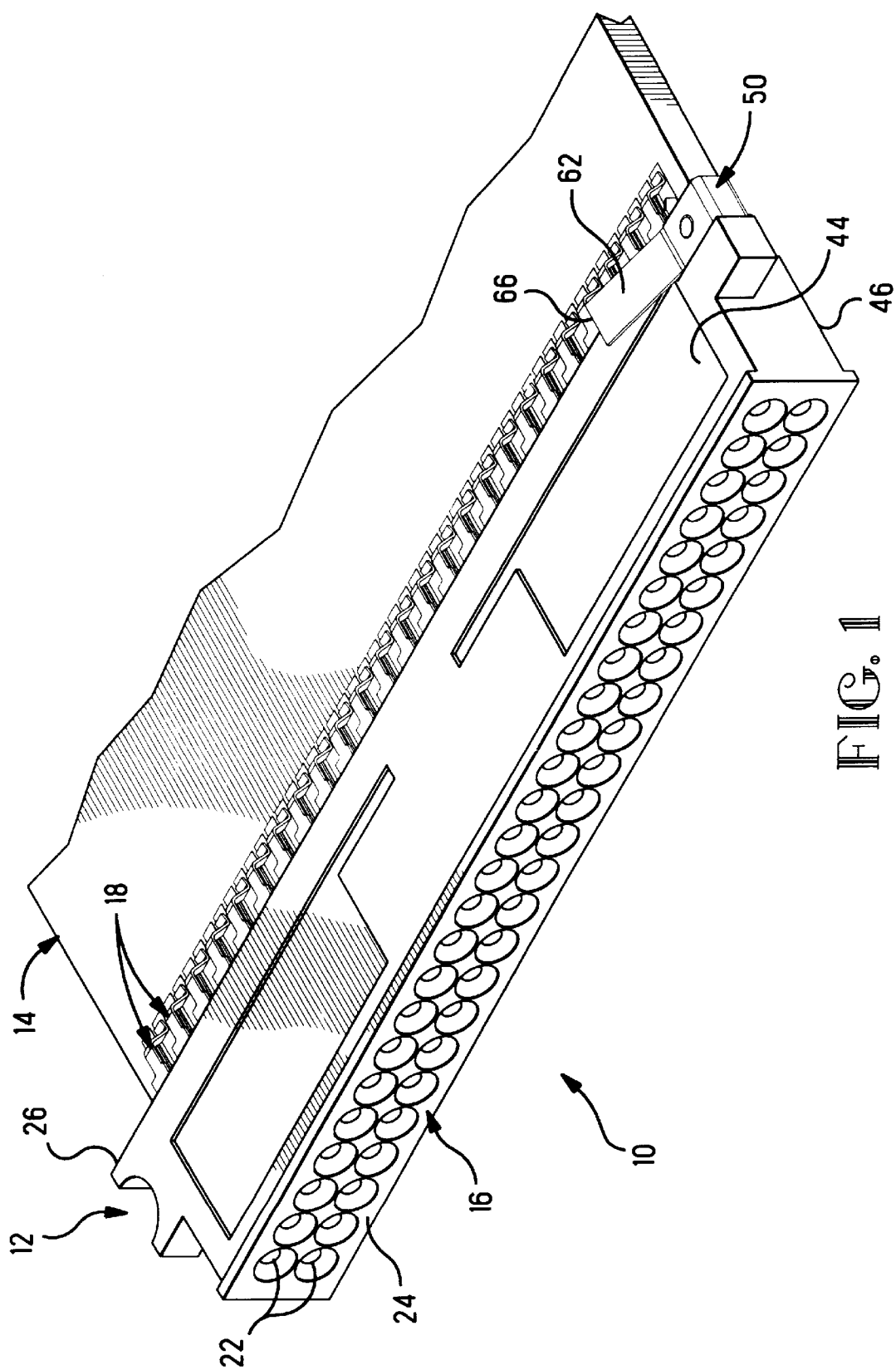
FIGS. 1 and 2 are front and rear isometric views of a circuit card for a memory card having affixed thereto an electrical connector having the grounding clip of the present invention.
Figure 2:
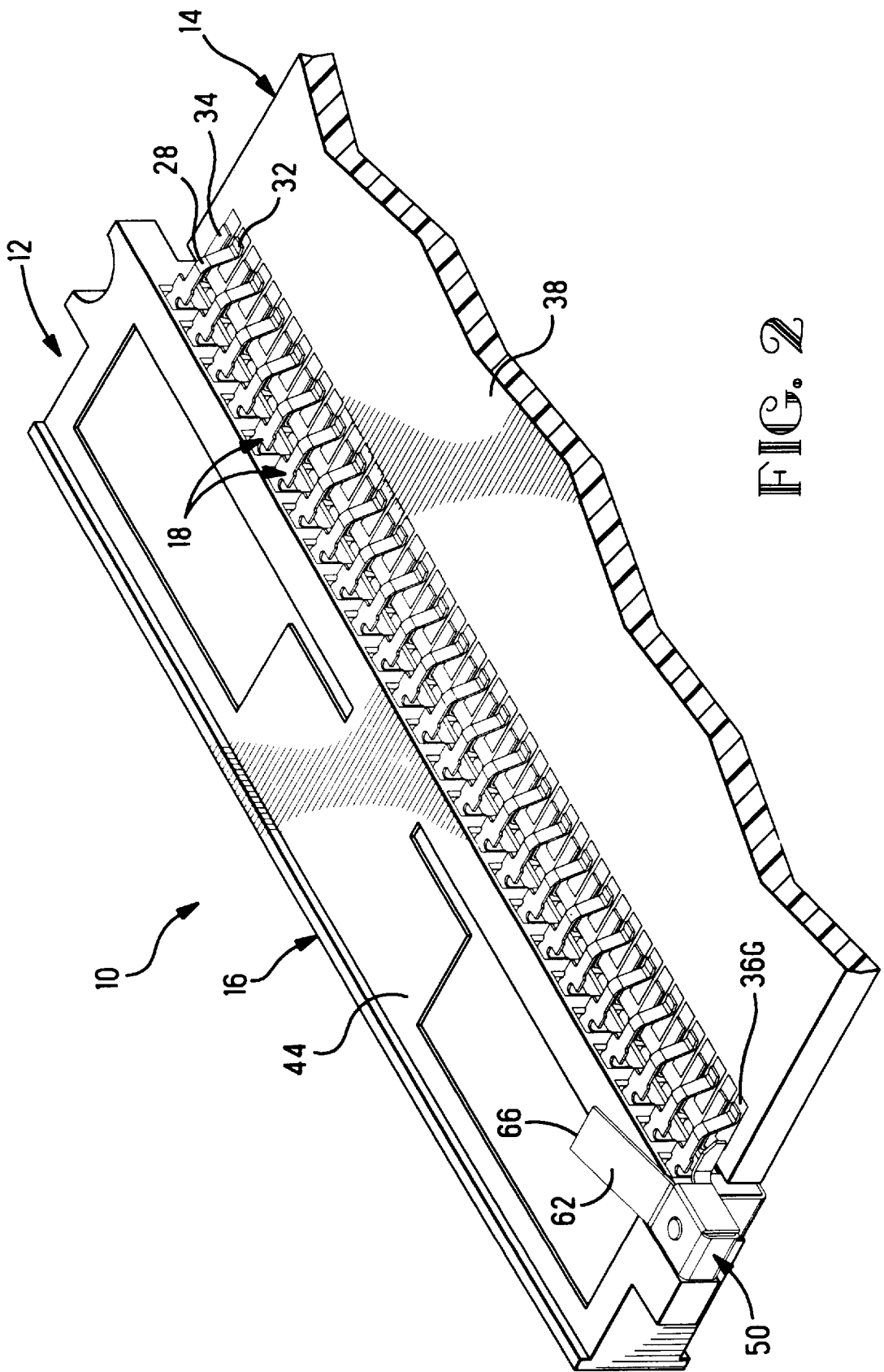

A connector 12 and circuit board 14 are shown in FIGS. 1 and 2 secured together to define a connector/board subassembly 10, for a memory card such as a PCMCIA card. Connector 12 includes a housing 16 of insulative material and two rows of contacts 18,20 secured within passageways 22 of the housing and extending from mating face 24 to rear face 26. Contacts 18,20 include rear sections 28,30 (FIG. 3) extending from rear face 26 to solder tails 32,34 disposed in a common plane for soldering to respective conductive pads 36 defined on a major surface 38 of circuit board 14 proximate leading edge 40 thereof.

Figure 3:
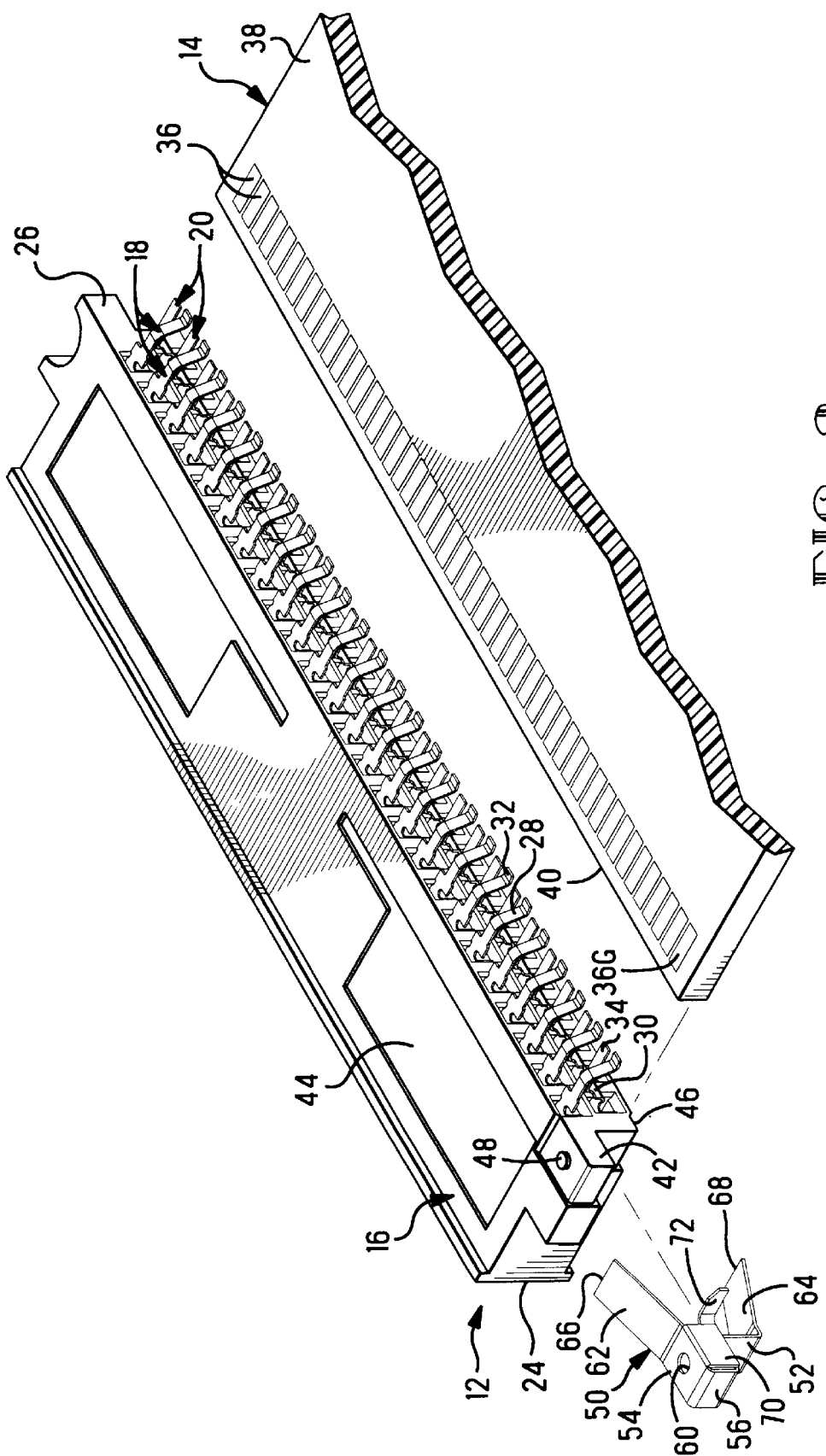
FIG. 3 is an exploded isometric view of the assembly of FIG. 2.
Figure 4:
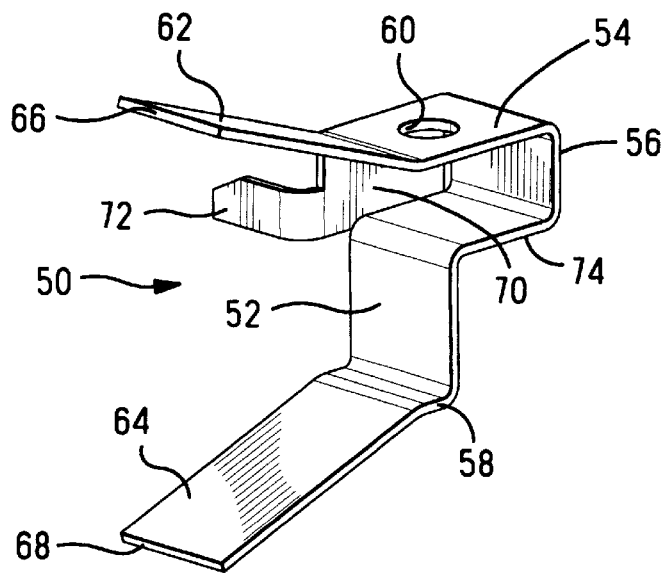
FIG. 4 is an isometric view of the grounding clip of the present invention.

Grounding clip 50 is shown best in FIGS. 3 and 4 and includes a body section 52 with top, side and bottom walls 54,56,58 adapted to be wrapped about a flange 42 of housing 16 and extend from the top housing surface 44 to the bottom housing surface 46, with side wall 56 including an offset 74 disposed against the bottom of flange 42. Top wall 54 is shown to include an aperture 60 through which will extend an embossment 48 along the top surface of the housing flange. Extending from top and bottom walls 54,58 and inwardly away from side wall 56, are cantilever beam spring arms 62,64 having free ends 66,68 diverging from the top and bottom housing surfaces 44,46. Grounding clip 50 further includes a back section 70 extending inwardly and rearwardly from which is a ground tab 72 associated with a ground pad 36A of circuit board 14.

Figure 5:
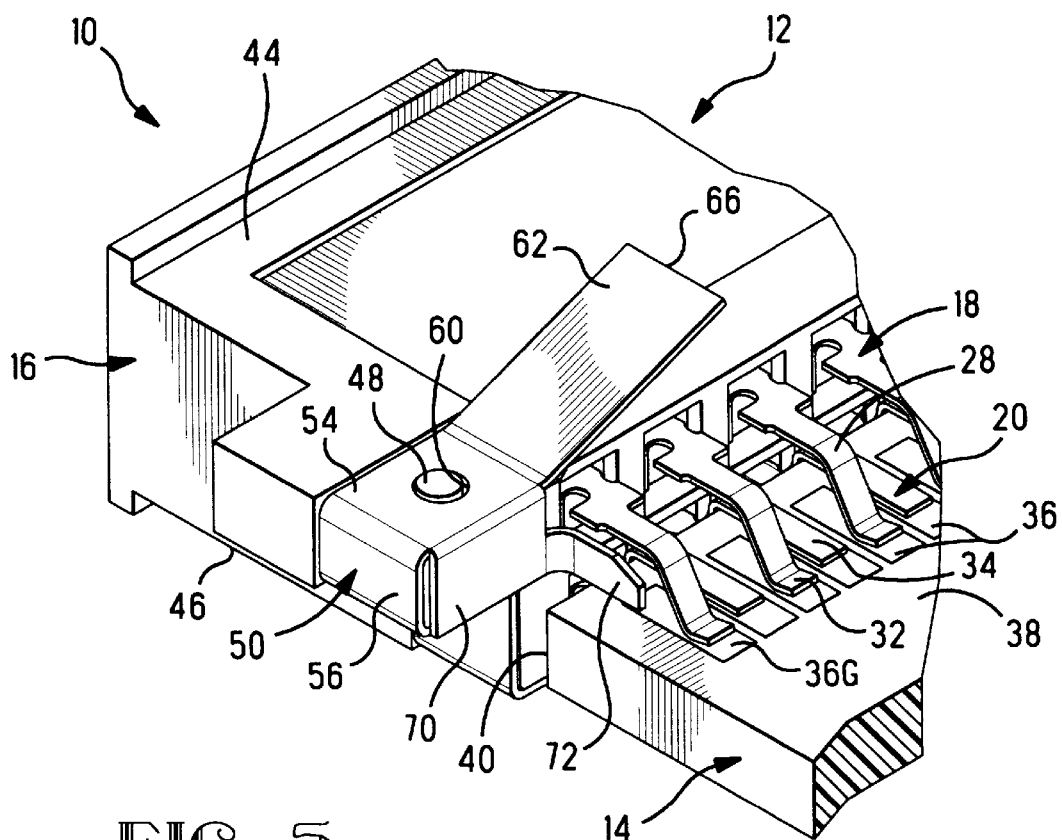
FIG. 5 is an enlarged isometric view of the connector/board subassembly with the grounding clip secured thereto.
Figure 6:
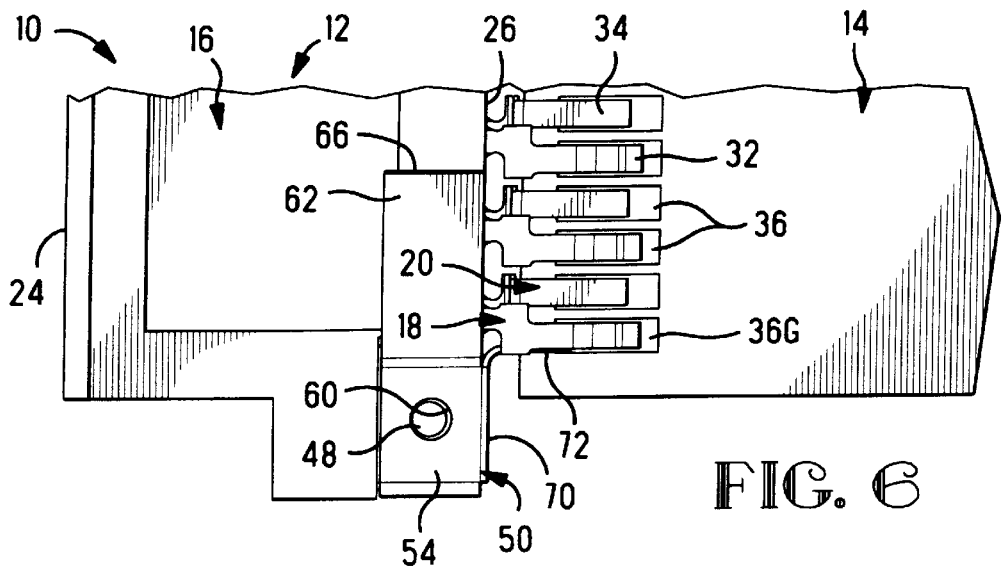
FIG. 6 is a plan view of the connector/board subassembly with the grounding clip secured thereto.
Figure 7:
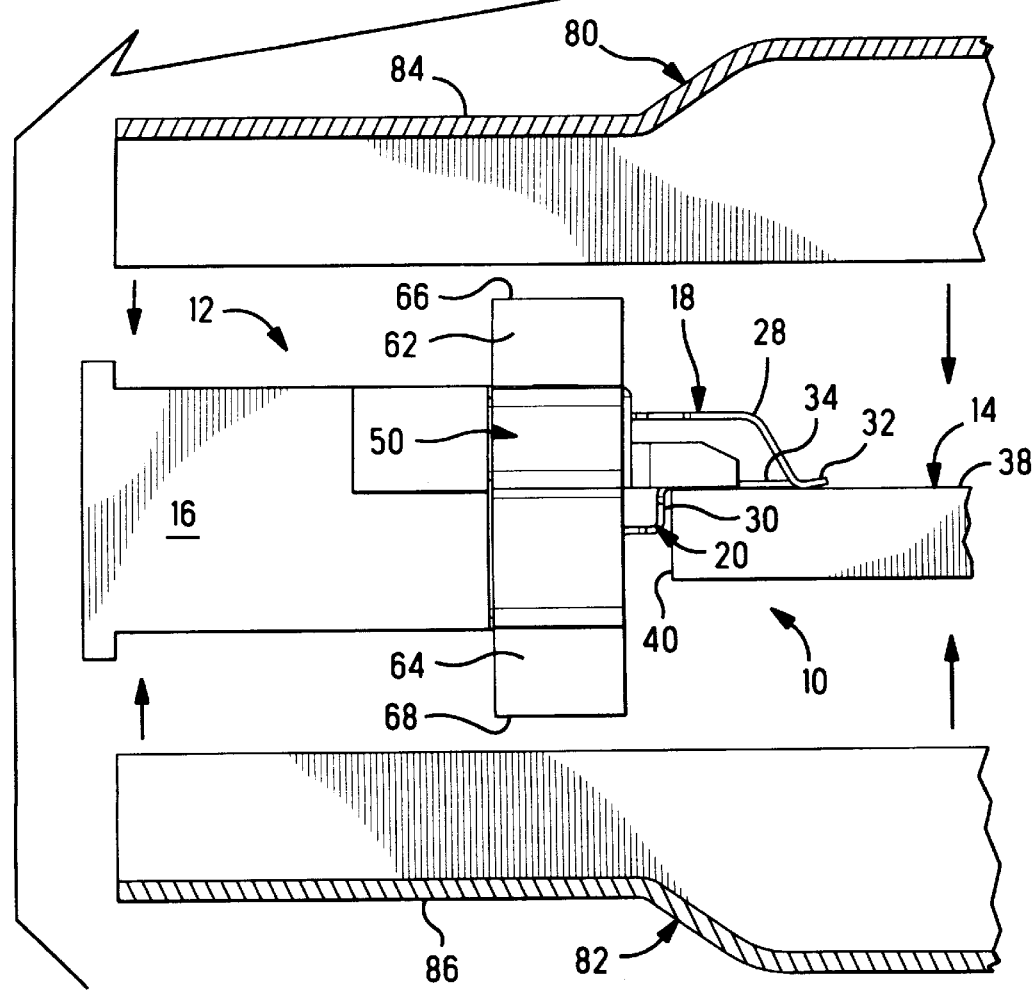
FIGS. 7 and 8 are side elevation views illustrating the shielding covers being secured around the connector/board subassembly.
Figure 8:
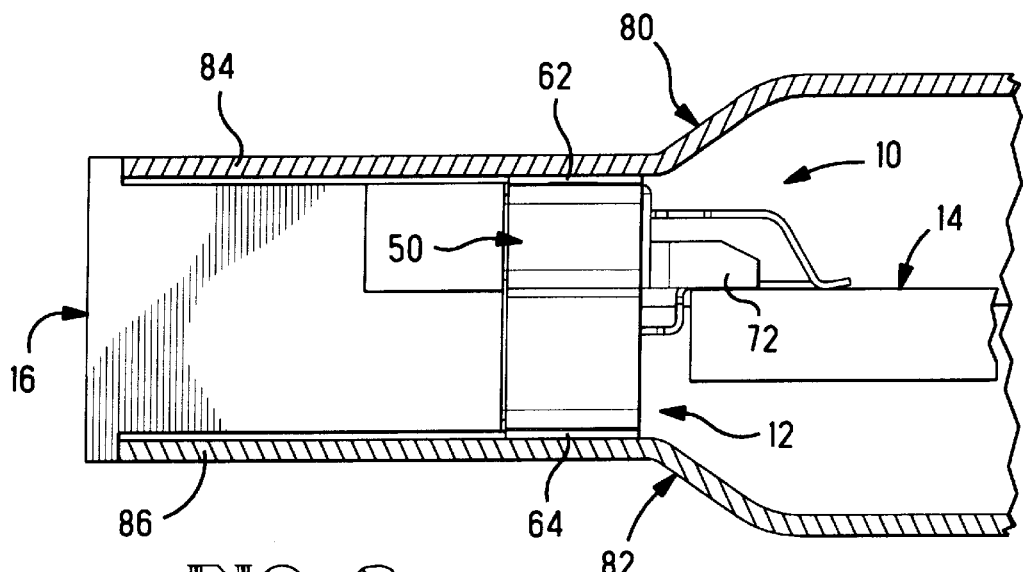
Figure 9:
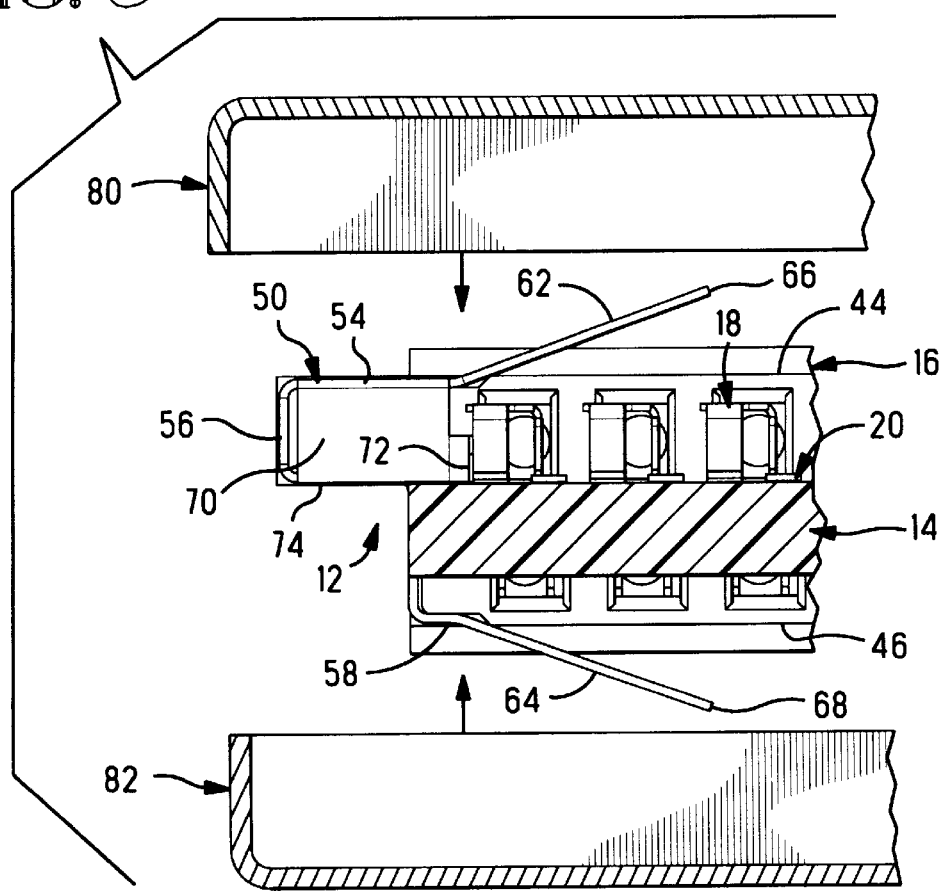
FIGS. 9 and 10 are longitudinal and cross-sectional views of the memory card, exploded and fully assembled respectively, illustrating the grounding clip interconnecting the circuit board and covers.
Figure 10:
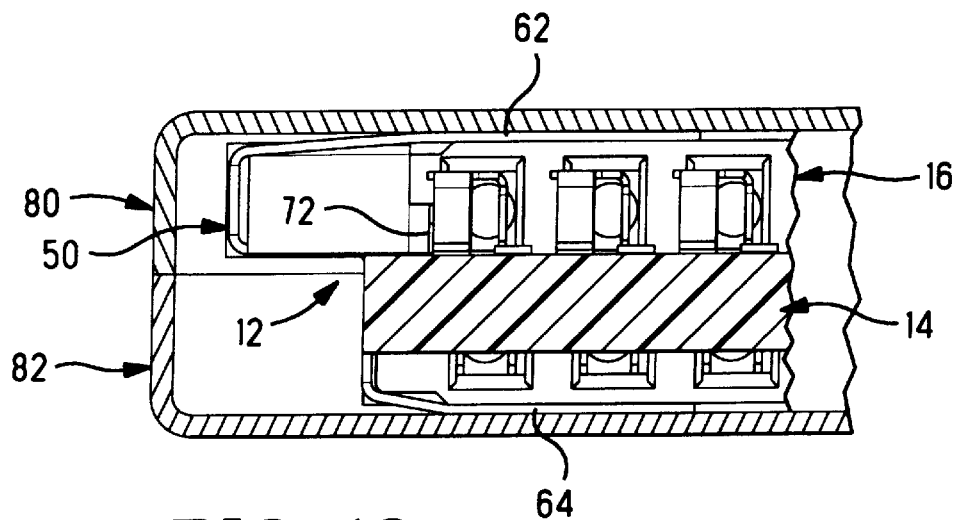

In FIGS. 5 and 6, grounding clip 50 is shown assembled to connector housing 16 with apertures 60 receiving embossments 48 of flange 42 therethrough, and showing upper spring arm 62 extending to its free end 66 diverging from the top housing surface 44. Once solder tails 32,34 of contacts 18,20 are soldered to respective conductive pads 36 of circuit board 14 and ground tab 72 is soldered to a ground pad 36G of the board; also shown soldered to ground tab 36G is the end position contact 18 serving as a ground contact for a ground circuit when the memory card is inserted into a card-receiving port of an electronic apparatus. The connector/board subassembly 10 is prepared for assembly of top and bottom conductive covers thereto.

FIGS. 7 to 10 show the assembling of top and bottom conductive covers 80,82 to the connector/board subassembly 10 to define the shield therearound. A frame (not shown) of insulative material is conventionally used to at least peripherally surround and hold the circuit card, and the covers are conventionally secured to the frame, as is disclosed in U.S. patent application Ser. No. 08/497,129 filed Jun. 30, 1995 and assigned to the assignee hereof. Forward sections 84,86 of covers 80,82 are associated with connector 12 and are disposed against top and bottom housing surfaces 44,46. As covers 80,82 are urged against the housing, free ends 66,68 of spring arms 62,64 are engaged by forward sections 84,86 and are deflected toward and against top and bottom housing surfaces 44,46, defining an assured ground connection with the top and bottom covers to ground the shield to the ground pad 36G of circuit board 14, when the covers are secured about the subassembly.

Figure 11:
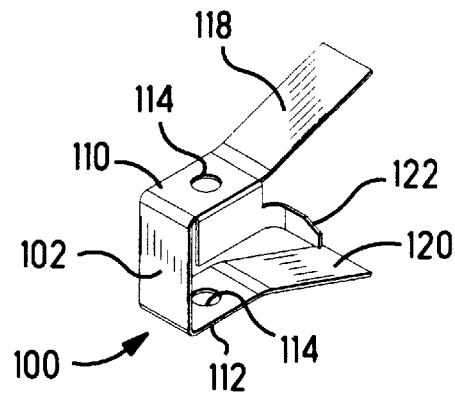
FIGS. 11 and 12 are isometric views of another embodiment of grounding clip, with FIG. 12 showing the clip secured to a side portion of a connector.
Figure 12:
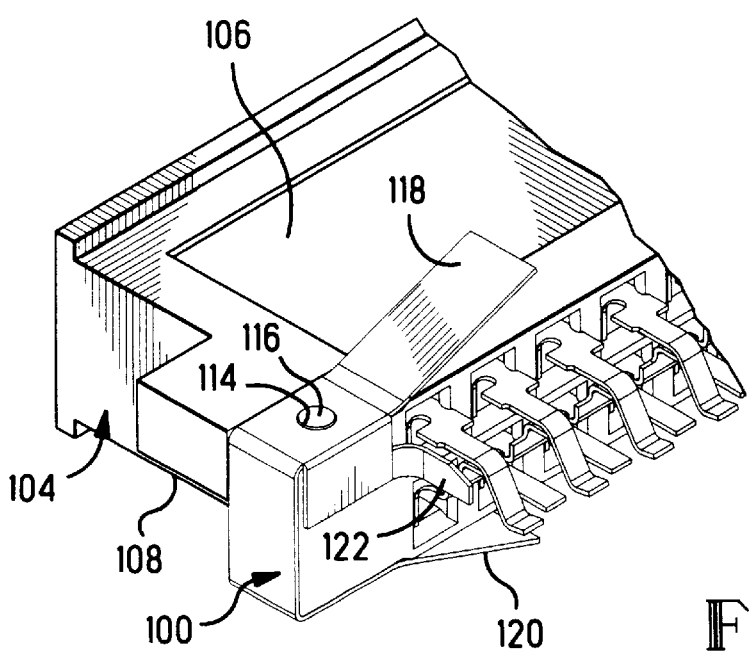

Another embodiment of grounding clip 100 is illustrated in FIGS. 11 and 12. Clip 100 includes a body section 102 adapted to conform to the associated portion of housing 104 that extends fully from top surface 106 to bottom surface 108. Top and bottom clip walls 110,112 each have an aperture 114 therethrough through which an embossment 116 of housing 104 extends, securing clip 100 in position without additional fastening means being necessary. Top and bottom spring arms 118,120 extend away from top and bottom housing surfaces 106,108 to be engaged by a respective cover (not shown), and ground tab 122 extending rearwardly for electrical connection to a ground circuit of a circuit board, as is shown in FIG. 3.

As is seen the Figures, the grounding clip is easily stamped and formed integrally from a blank of metal such as brass, and is easily securable to the housing. A second ground clip may be utilized and may be mounted for example along the opposite side of the housing, if desired. Other techniques may be utilized to mount the ground clip or clips to the housing. Variations and modifications may be made to the grounding clip of the specifically disclosed example of the present invention, that are within the spirit of the invention and the scope of the claims.

What is claimed is:

1. An electrical connector securable to an edge of a circuit card in fabricating a memory card, comprising:

an insulative housing having an array of contacts extending from a mating face to a rear face and including solder tails extending from the rear face associated with conductive pads of a circuit card; and at least one grounding clip mountable to a section of said housing along said rear face and including a ground tab adapted to be electrically connected to a ground circuit of the circuit card, and further including at least one spring arm disposed along an outer surface of said housing and diverging therefrom, whereby said at least one spring arm is engageable and deflectable toward said housing by a conductive cover for shielding said connector and said circuit card, thereby grounding said cover to the ground circuit of said circuit card.

2. An electrical connector as set forth in claim 1 having a pair of said spring arms, said spring arms being disposed along opposed surfaces of said insulative housing to be engaged respectively by top and bottom shielding covers.

3. An electrical connector as set forth in claim 1 wherein said grounding clip includes a rear wall extending along said rear housing face, and said ground tab extends rearwardly from said rear wall.

4. An electrical connector as set forth, in claim 1 wherein said housing includes a flange at at least one end of said rear face and said grounding clip includes a body section wrapped around said flange.

5. An electrical connector as set forth in claim 4 wherein said flange includes at least one embossment extending outwardly therefrom, and said grounding clip body section includes a corresponding aperture therethrough through which said embossment extends to secure said grounding clip to said housing.

6. A grounding clip for grounding a conductive shield of a memory card to a ground circuit of a circuit card within the memory card, comprising:

a body section adapted to be affixed to a connector to be mounted to a circuit card of said memory card along a rear housing face, at least one spring arm extending from said body section to be engaged and deflected by a conductive shield of said memory card upon assembly thereto, and at least one ground tab extending along said housing rear face to be electrically connected to a ground circuit of said circuit card, all upon assembly of said memory card.

7. The grounding clip as set forth in claim 6 wherein a rear wall extends from one of said top wall, side wall and bottom wall from which extends said ground tab outwardly from said body section.

8. The grounding clip as set forth in claim 6 wherein said body section includes a top wall, a side wall and a bottom wall, and embossment-receiving apertures are defined in said top and bottom walls.

9. The grounding clip as set forth in claim 8 wherein said at least one spring arm extends from said top wall away from said side wall.

10. The grounding clip as set forth in claim 9 wherein a second said spring arm extends from said bottom wall away from said side wall.

* * * * *